(12) United States Patent
Roy et al.

(10) Patent No.: US 11,946,988 B2
(45) Date of Patent: Apr. 2, 2024

(54) VEHICLE BATTERY CURRENT SENSING SYSTEM

(71) Applicant: Purdue Research Foundation, West Lafayette, IN (US)

(72) Inventors: Kaushik Roy, West Lafayette, IN (US); Byunghoo Jung, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 18/091,070

(22) Filed: Dec. 29, 2022

(65) Prior Publication Data

US 2023/0152397 A1    May 18, 2023

Related U.S. Application Data

(63) Continuation of application No. 16/466,281, filed as application No. PCT/US2017/064567 on Dec. 4, 2017, now Pat. No. 11,543,471.

(Continued)

(51) Int. Cl.
    *G01R 33/09*      (2006.01)
    *G01R 15/20*      (2006.01)

(52) U.S. Cl.
    CPC ......... *G01R 33/098* (2013.01); *G01R 15/205* (2013.01); *G01R 15/207* (2013.01)

(58) Field of Classification Search
    CPC ...... G01R 33/06; G01R 33/07; G01R 33/072; G01R 33/075; G01R 33/077;
    (Continued)

(56) References Cited

U.S. PATENT DOCUMENTS 8,564,285 B2    10/2013   Romero et al.
2005/0156587 A1*  7/2005  Yakymyshyn ....... G01R 15/207
                                              324/117 R
(Continued)

FOREIGN PATENT DOCUMENTS

JP    2013537626 A    10/2013
JP    2014055839 A     3/2014
(Continued)

OTHER PUBLICATIONS

Doug Lowe, Switches in Electronic Circuits: Poles and Throws, updated Mar. 26, 2016, obtained from https://www.dummies.com/article/technology/electronics/circuitry/switches-in-electronic-circuits-poles-and-throws-180193/ (Year: 2016).*

(Continued)

*Primary Examiner* — David M Schindler
(74) *Attorney, Agent, or Firm* — Maginot, Moore & Beck LLP

(57) ABSTRACT

A method of sensing a current in a conductor includes controlling a digital to analog converter output to cancel residual offset voltage in a magnetic tunnel junction device prior to sensing the current with the magnetic tunnel junction device. The method includes switching input to the magnetic tunnel junction device between a fixed voltage and an output of a digital to analog converter while switching input to a band pass filter between a lower and an upper voltage output of the magnetic tunnel junction device. The output of the digital to analog converter is modified to provide a low-amplitude unsaturated sine-wave at an output of the band pass filter, at which point changes in the output of the band pass filter are associated with the amount of current in a sensed conductor.

6 Claims, 8 Drawing Sheets

Related U.S. Application Data

(60) Provisional application No. 62/429,181, filed on Dec. 2, 2016.

(58) Field of Classification Search
CPC .... G01R 33/098; G01R 33/09; G01R 33/091; G01R 33/093; G01R 33/095; G01R 33/096; G01R 15/20; G01R 15/202; G01R 15/205; G01R 15/207
See application file for complete search history.

(56) References Cited

U.S. PATENT DOCUMENTS

| | | |
|---|---|---|
| 2007/0063690 A1 | 3/2007 | De Wilde et al. |
| 2007/0097732 A1 | 5/2007 | Chung et al. |
| 2008/0258721 A1 | 10/2008 | Guo et al. |
| 2011/0202295 A1 | 8/2011 | Tamura et al. |
| 2013/0073238 A1* | 3/2013 | Nomura ............... G01R 33/09 324/252 |
| 2013/0116955 A1 | 5/2013 | Williams |
| 2013/0249531 A1 | 9/2013 | Aratono et al. |
| 2014/0062471 A1 | 3/2014 | Deak et al. |
| 2014/0327437 A1 | 11/2014 | Han et al. |
| 2015/0028878 A1* | 1/2015 | Tsujimoto ............. H01M 10/44 324/426 |
| 2017/0030979 A1 | 2/2017 | Cesaretti |
| 2019/0170795 A1 | 6/2019 | Sugito et al. |
| 2019/0293689 A1 | 9/2019 | Lerner et al. |
| 2019/0293733 A1 | 9/2019 | Esaka et al. |

FOREIGN PATENT DOCUMENTS

| | | |
|---|---|---|
| JP | 2015038464 A | 2/2015 |
| JP | 2015504816 A | 2/2015 |

OTHER PUBLICATIONS

Japanese Office Action related to Japanese Application No. 2019529932 dated Dec. 2, 2021 (4 Pages).
Machine Translation of Japanese Office Action related to Japanese Application No. 2019529932 dated Dec. 2, 2021 (5 Pages).
International Search Report in related case No. PCT/US17/64567, dated Mar. 7, 2018.

* cited by examiner

VEHICLE BATTERY CURRENT SENSING SYSTEM

CROSS-REFERENCE TO RELATED APPLICATIONS

The present application is a continuation application of U.S. patent application Ser. No. 16/466,281, filed Jun. 3, 2019, which issued as U.S. Pat. No. 11,543,471 on Jan. 3, 2023, which is a 35 U.S.C. § 371 National Stage Application of PCT/US17/64567, filed on Dec. 14, 2017, and is related to and claims the priority benefit of U.S. Provisional Patent Application Ser. No. 62/429,181, filed Dec. 2, 2016, the contents of which are hereby incorporated by reference in their entirety into this disclosure.

TECHNICAL FIELD

The present application relates to current sensing systems, and more specifically, to a non-invasive vehicle battery current sensing system.

BACKGROUND

In recent years, electric vehicles (EVs) and hybrid-electric vehicles (HEVs) have entered a new era of much greater consumer acceptance. Compared to gasoline-powered cars, the reduced dependence on oil and lower emissions make them an attractive choice for the future of the transportation industry. The electric power in an EV is provided by a large series/parallel interconnection of rechargeable lithium-ion batteries. To ensure reliable and efficient operation of the batteries and early fault diagnosis, it is essential to have a simplified solution for predicting the health of various sub-systems in the vehicle. While, on one hand, the leakage current (a few milliamperes) between parallel connected batteries can point to inefficient impedance matching, on the other hand, a sharp spike in current (a few 100s of Amperes) through the wires can be an indication of a short-circuit path requiring immediate user attention. Hence, it is critical to have a unified solution which can non-invasively measure both DC and AC currents over a wide-range with a high-resolution.

There are several current measurement techniques proposed for EV/REV applications each with their own strengths and weaknesses. The shunt method is one of the most rudimentary methods of measuring the current where the voltage drop across a resistor in series with the battery is used to calculate the current. Companies such as Texas Instruments and SENDYNE have proposed shunt sensor designs for automotive applications with galvanic isolation between the processing unit and the current sensing circuit. However the shunt implementation is invasive and results in significant power loss during high current operation. Hall Effect sensors are also popular in current measurement applications owing to their low cost and the galvanic isolation they provide. However these sensors are very sensitive to magnetic fields and can be easily affected by stray fields inducing significant errors in small current measurements. Hall Effect sensors designed to measure small currents (<10 A) accurately must be shielded from stray fields and are invasive. Current transformers and Rogowski coils are current transducers that can operate in a wide frequency range. These devices are non-invasive, but can only measure AC currents, and hence cannot be used in EV/HEV applications. Another noninvasive technology for current measurement is the flux-gate current sensor. This sensor can measure down to low currents (~50 mA) with a good dynamic range. However, flux-gate current sensors can be costly and bulky due to their complex magnetics and can have high self-heating due to large quiescent currents. Therefore, improvements are needed in the field.

SUMMARY

According to one aspect, the present disclosure provides a non-invasive current sensor comprising a TMR magnetic-field sensor, which utilizes a Tunnel Magnetoresistance (TMR) effect in a Magnetic Tunnel Junction (MTJ) to generate a linear differential-output voltage proportional to the magnetic field perpendicular to its package. An MTJ consists of a thin insulator sandwiched between two ferromagnets. The direction of the two magnetizations of the ferromagnetic films can be changed by an external magnetic field. If the magnetizations are in a parallel orientation it is more likely that electrons will tunnel through the insulating film than if they are in the oppositional (antiparallel) orientation. Hence as the orientation of the ferromagnetic layers change the effective resistance across the device would also change. Consequently, such a junction can be smoothly transitioned across various states of resistance through the application of an external magnetic field. When installed on a current-carrying conductor of an electric vehicle, the presently disclosed current sensor enables measurement of currents ranging 10 mA-150 A with a resolution of 10 mA.

BRIEF DESCRIPTION OF THE DRAWINGS

In the following description and drawings, identical reference numerals have been used, where possible, to designate identical features that are common to the drawings.

The attached drawings are for purposes of illustration and are not necessarily to scale.

DETAILED DESCRIPTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1A:
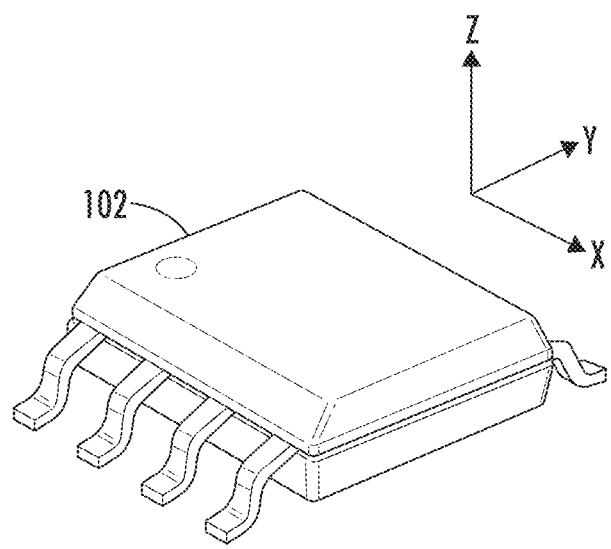
FIG. 1(a) shows a TMR magnetic field sensor according to one embodiment.
Figure 1B:
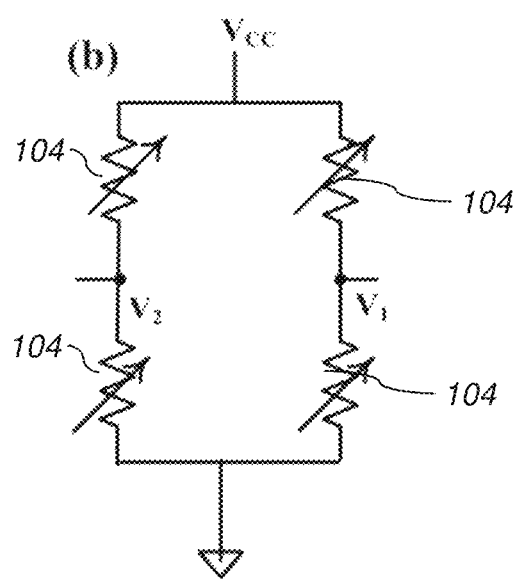
FIG. 1(b) shows a schematic of the sensor of FIG. 1(a) according to one embodiment.
Figure 1C:
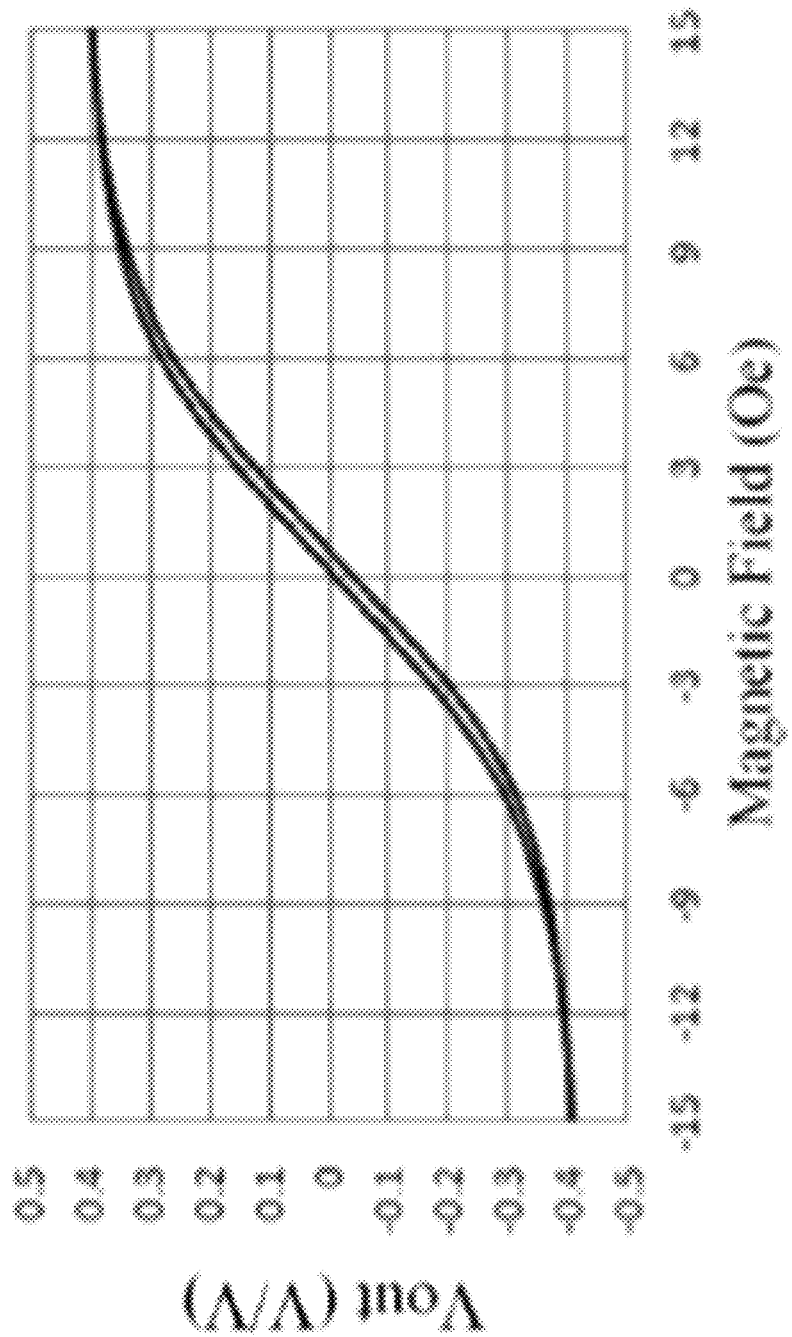
FIG. 1(c) shows the response of an example TMR magnetic field sensor to an applied magnetic field in the range of +−50 Oe when the TMR2905 is biased at IV.

FIG. 1(a) shows an example of a TMR magnetic field sensor 102 which is used as a current sensor according to one embodiment. FIG. 1(b) shows the associated component schematic. As shown, the TMR may be implemented as a push-pull Wheatstone bridge configuration of four unshielded MTJ elements 104 which act as magnetic-field dependent variable resistors as shown in FIG. 1 (b). The push-pull design provides a highly sensitive differential output that is linearly proportional to the magnetic field applied perpendicular to the surface of the sensor package (along z-axis) as shown in FIG. 1(a). FIG. 1(c) shows the response of the TMR (a TMR 2905 from Multidimension Technology Co., Ltd. in the illustrated example) to an applied magnetic field in the range of +−50 Oe when the TMR2905 is biased at IV.

Figure 2:
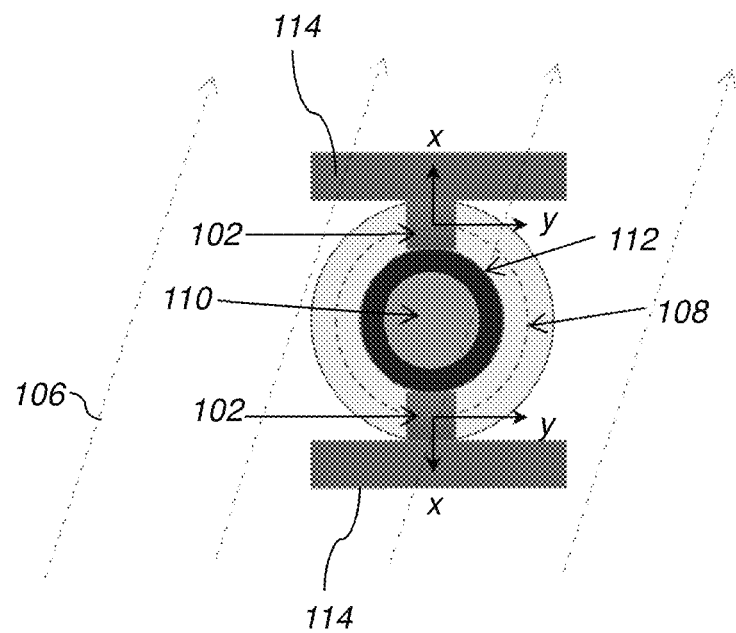
FIG. 2 shows a differential sensor arrangement according to one embodiment.

To further improve the sensitivity of the TMR sensor 102, a high-amplification of the sensor output is needed. Experiments reveal that $V_1 \neq V_2$ of the sensor even under the absence of the magnetic field, i.e. there is an inherent offset in the differential-voltage. This calls for an efficient offset-cancellation methodology, so that the differential voltage actually resulting from the external magnetic field can be accurately measured. Further, for reliable and low-resolution current sensing, several noise-cancellation procedures are employed both at analog and digital frontends. In one embodiment, to cancel any common-mode noise and interfering magnetic field, a differential arrangement of two of the sensors 102 is provided as shown in FIG. 2. As shown, the sensors 102 are placed 180° apart on a circular current carrying conductor 110 (with insulation 112) to enable differential sensing of the magnetic field 108 produced by current in the conductor 110 and efficient common-mode noise cancellation of the interfering external magnetic field 106. The sensors 102 may be also mounted against a substrate 114 (e.g., a metal free PCB board) as shown to maintain their position relative to the conductor 110.

Assuming that the magnetic-field due to the current-carrying conductor 110, at the location of the sensor 102, is $B_{IN}$, and the total external field is $B_{ext}$ respectively, then the magnetic field measured by each sensor can be written as:

$$S_1, \text{input} = B_{IN} + B_{ext}$$

$$S_2, \text{input} = -B_{IN} + B_{ext}$$

The output of the two TMR sensors with the applied magnetic field can be written as:

$$S_1, \text{input} = (B_{IN} + B_{ext})C_1$$

$$S_2, \text{output} = (-B_{IN} + B_{ext})C_2$$

Here, $C_1$ and $C_2$ incorporate the sensitivities of the two TMR sensors and the gains of the analog front end. If the system is perfectly symmetrical the values $C_1$ & $C_2$ will be identical giving a differential output $$\Delta S_- = S_{1,output} - S_{2,output} = 2CB_{IN} = 2C\left(\frac{\mu_0 I_{IN}}{2\pi r}\right), \text{ where} \quad (1)$$

$$C_1 = C_2 = C$$

$$A\Delta S_- = I_{IN}$$

Hence, the differential measurement rejects common mode noise, and stray fields (including Earth's magnetic field).

Figure 3:
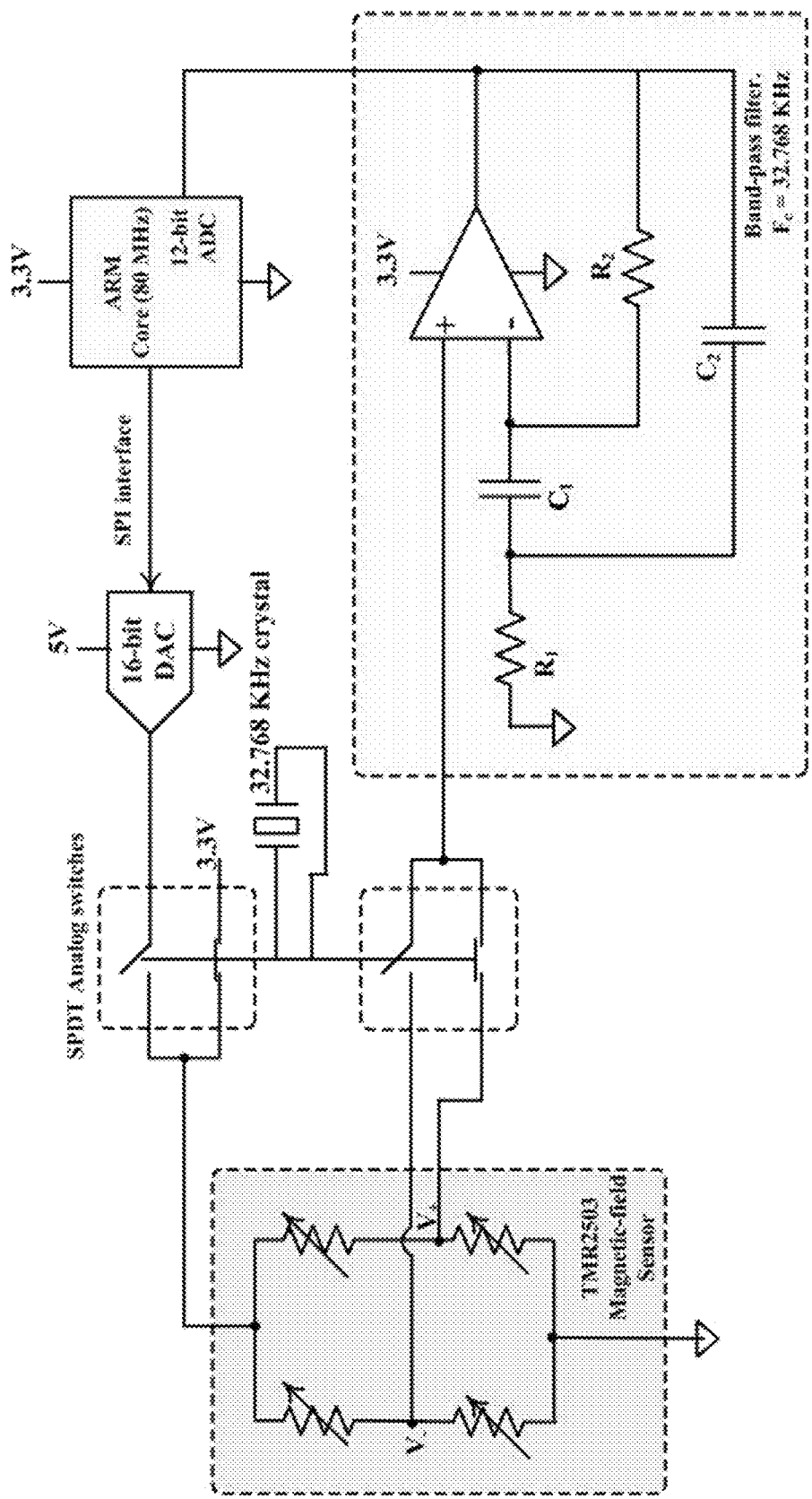
FIG. 3 shows an example system diagram incorporating the sensors of FIG. 1(a).

FIG. 3 shows an example architecture of the current sensing system 300 according to one embodiment. The heart of sensing mechanism includes a sensor 102 (e.g., TMR2905 magnetic-field sensor) placed in close proximity to the current-carrying conductor 110.

This section demonstrates an exemplary implementation of the above stated method for non-invasive, high-resolution sensing of DC and AC currents. FIG. 3 shows the experimental setup for each of the top and bottom sensors 102. Both top and bottom sensors 102 have the same architecture separately, except for the parallel orientation of sensor's z-axis for efficient common-mode noise cancellation, as described above (FIG. 2). For simplicity, here we describe the current sensing mechanism for DC currents. The residual offset voltage in each of the top and bottom TMR sensors is cancelled as follows.

Figure 4:
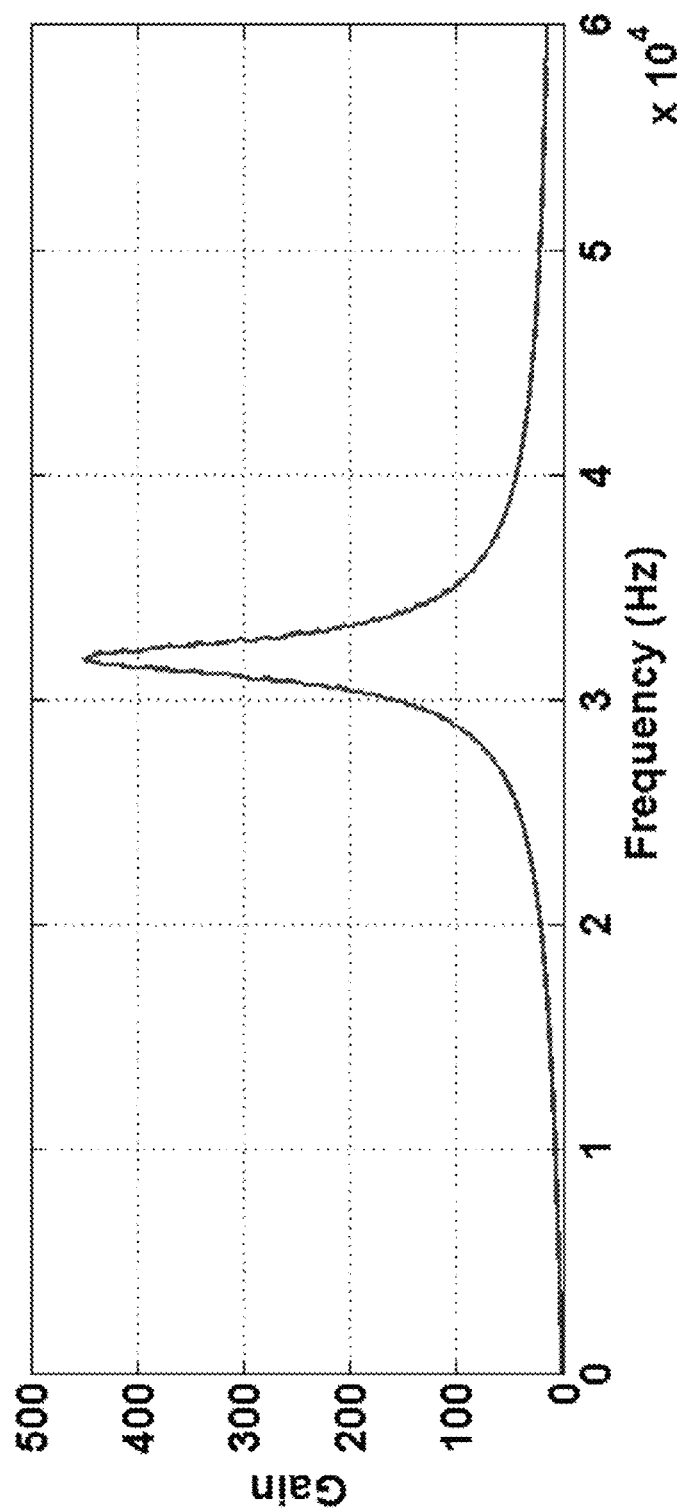
FIG. 4 shows the frequency response of the analog band-pass filter using $R_1=82\Omega$, $R_2=200K\ \Omega$, $C_1=C_2=1$ nF.

Assume that the offset between $V_+$ and $V_-$ is positive $\Delta V$ ($\Delta V = V_+ - V_-$). We up-convert the DC $V_+$ and $V_-$ to 32.768 KHz by using analog Single-Pole Double Throw (SPDT) switches driven by 32.768 KHz crystal. FIG. 3 shows a situation where bottom switches in both SPDT switches establish the connection of 3.3V to the supply of TMR sensor, and $V_+$ output of the sensor to the input of the band-pass filter. In the next phase, the DAC-output connects to the input of the band-pass filter, thereby resulting in a square-wave (with rail-to-rail swing of $\Delta V$) at the input of band-pass filter. We choose multiple-feedback topology for the band-pass filter, centered at 32.768 KHz ($f_0$), to realize a high-Q filter, thereby minimizing flicker noise from op-amp while also rejecting undesirable high-frequency noise components. For high-resolution current detection, the amplification ratio is set to ~450. FIG. 4 shows the frequency response of the analog band-pass filter using $R_1 = 82\Omega$, $R_2 = 200K\Omega$, $C_1 = C_2 = 1n$ F.

The resulting sine-wave at filter output is fed to 12-bit ADC operating at 327.68 KHz ($f_s = 10f_0$). The residual offset voltage, after amplification by ~450×, saturates the op-amp output. The DAC's output voltage is increased/decreased until V− becomes close to $V_+$, i.e. until the offset is reduced sufficiently enough to result in a low-amplitude unsaturated sine-wave at filter output. Now, any change in $V_+ - V_-$, due to external magnetic field, can be easily sensed by detecting the change in sine-wave amplitude from its previous value.

To estimate the current flowing through the wire, we subtract the sampled values from the two oppositely placed sensors to get a differential reading, thereby rejecting any common-mode noise, as described in previous section. The resulting differential sine-wave is cross-correlated with an internally generated and stored digital sine-wave of exactly same $f_o$ and $f_s$. The equations governing the optimal detection of the amplitude of differential sine-wave are as follows:

$$a = \sum_{1}^{N} x[n] \sin\left(2\pi \frac{f_0}{f_s} n\right)$$

$$b = \sum_{1}^{N} x[n] \cos\left(2\pi \frac{f_0}{f_s} n\right)$$

$$y = \sqrt{a^2 + b^2},$$

where fo is the sine-wave frequency (32.768 KRz), $f_s$ is the sampling frequency, N is the total number of samples in a computation.

y gives the estimate of the amplitude which linearly relates to the current flowing through the wire.

Figure 5:
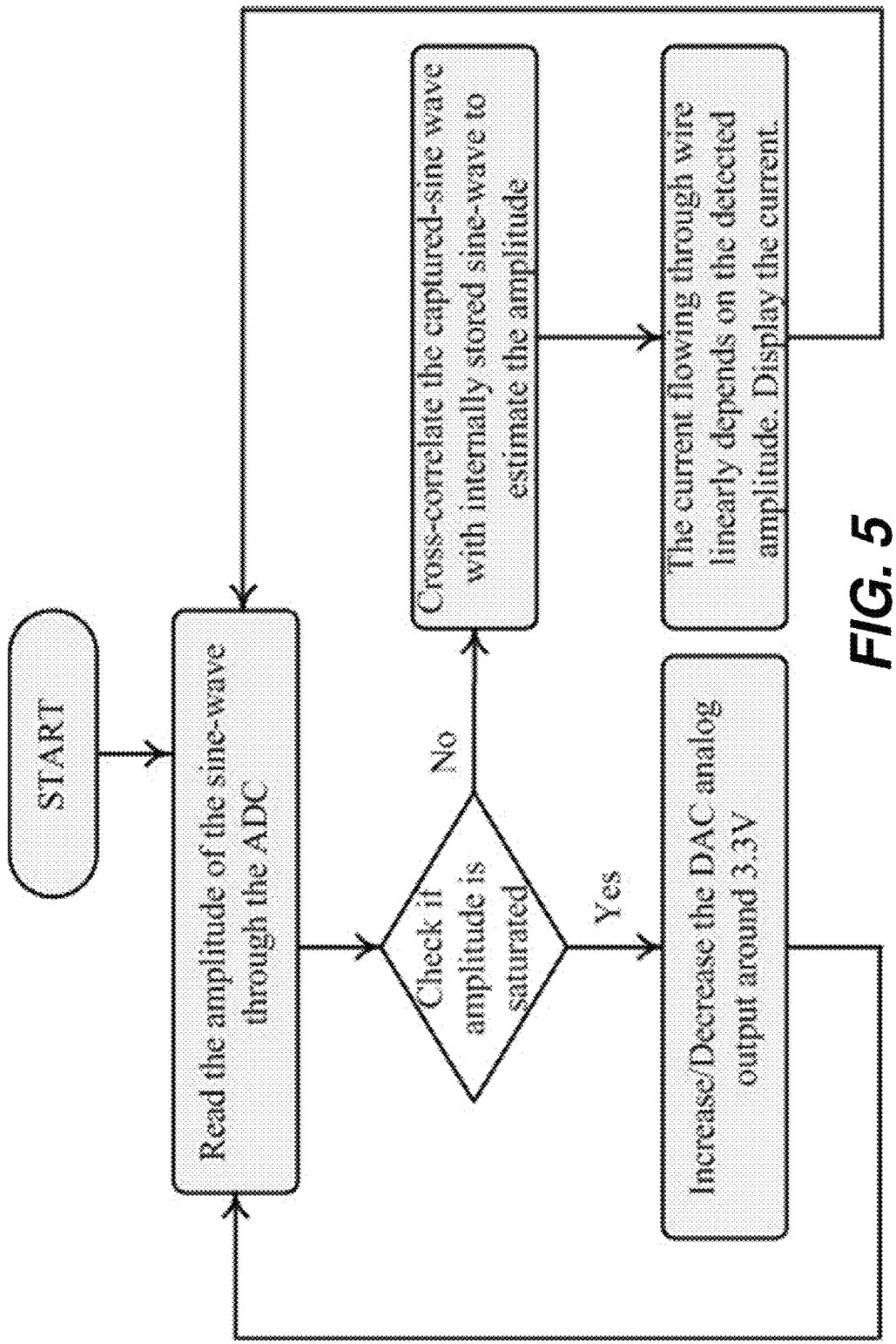
FIG. 5 shows a process for sensing current through a conductor using the sensor of FIG. 1(c) according to one embodiment.

A flowchart describing the computational steps in the above example embodiment is shown in FIG. 5. The process starts when the amplitude of the sine-wave through the analog-to-digital converter is read. Next, the system checks to see if the amplitude is saturated. If it is, the system increases or decreases the DAC analog output (e.g., about 3.3V) and rechecks the amplitude for saturation. Once an acceptable output is reached (non-saturation), the system cross-correlates the captured sine wave with internally stored sine-wave to estimate the amplitude. The amplitude is then used to determine the current flowing through the conductor 110 since the current linearly depends on the detected amplitude. The current may then be displayed or otherwise received by the vehicle control system to take appropriate remedial measures.

Figure 6:
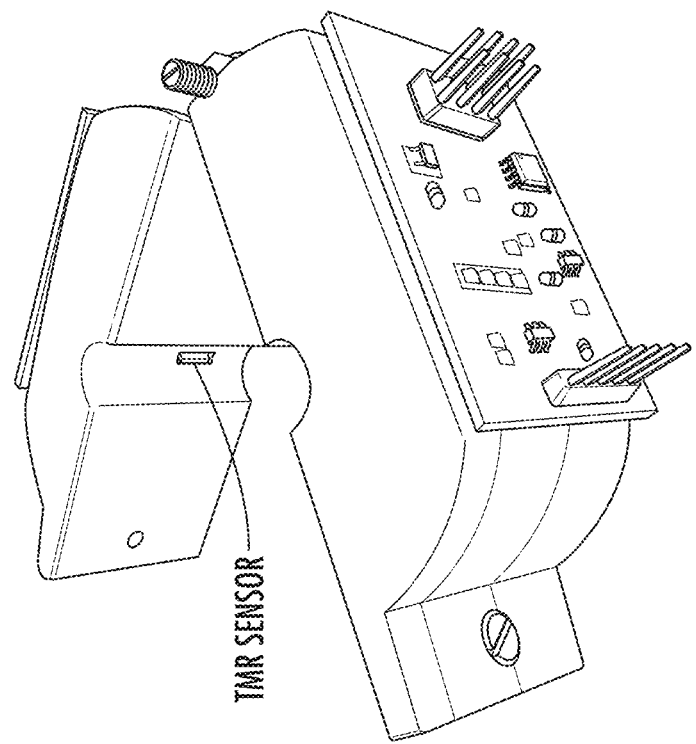
FIG. 6 shows an example current sensing system for mounting the sensors of FIG. 1(c) according to one embodiment.
Figure 6:
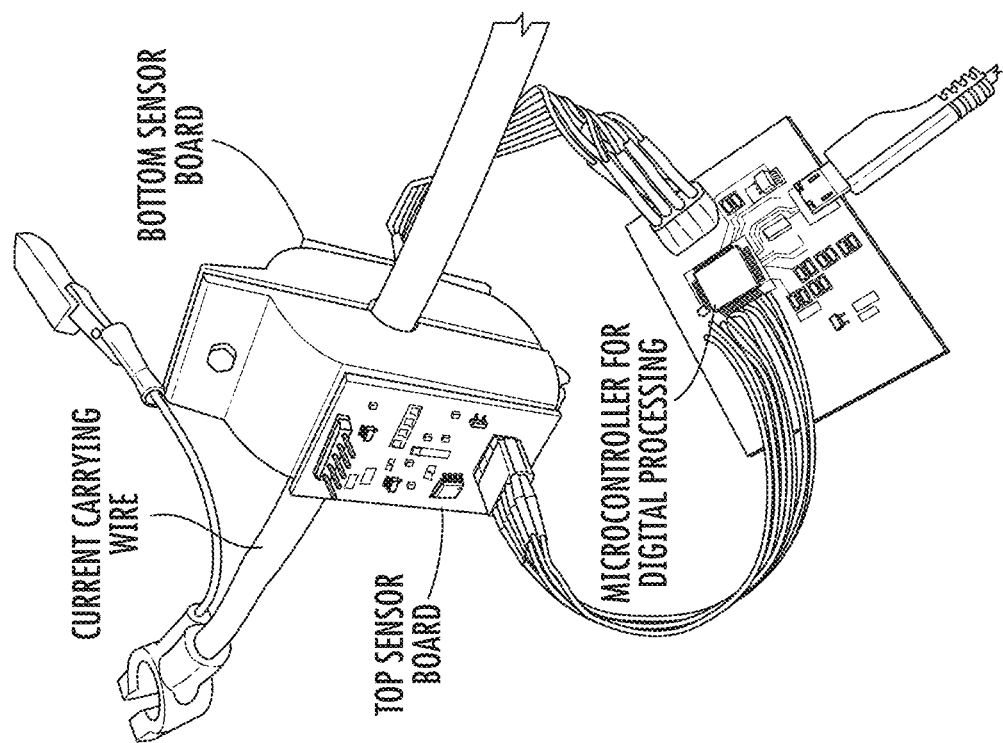

FIG. 6 shows one example implementation which includes two housing portions, each with a TMR sensor 102 embedded therein to allow the two sensors 102 to be mounted 180 degrees apart on a conductor wire.

In certain embodiments, four sensors 102 may be used, with two sensors on each side of the conductor, wherein the two sensors on one side are mounted orthogonal to each other. The interference can be further cancelled by using a correlation among the measured outputs of the four sensors.

The sensors 102 and other components recited herein may include or be connected to one or more computer processors and memory which are communicatively connected and programmed to perform the data processing and control functionality recited herein. The program code includes computer program instructions that can be loaded into the processor, and that, when loaded into processor cause functions, acts, or operational steps of various aspects herein to be performed by the processor. Computer program code for carrying out operations for various aspects described herein can be written in any combination of one or more programming language(s), and can be loaded into memory for execution. The processors and memory may further be communicatively connected to external devices via a wired or wireless computer network for sending and receiving data.

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a nonexclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

What is claimed is:

1. A method of sensing a current, comprising:
sequentially connecting a first fixed voltage and an output of a first digital to analog converter to an input of a first magnetic tunnel junction device, using a first single pole double throw analog switch;
sequentially connecting a V+ output and a V− output of the first magnetic tunnel junction device to an input of a first band pass filter using a second single pole double throw analog switch, wherein the first single pole double throw analog switch is configured such that the first fixed voltage is connected to the input of the first magnetic tunnel junction device when the V+ output is connected to the input of the first band pass filter, and the first digital to analog converter is connected to the input of the first magnetic tunnel junction device when the V− output is connected to the input of the first band pass filter;
modifying the output of the first digital to analog converter such that an output of the first band pass filter produces an unsaturated sine wave; and
measuring a current passing through a conductor electrically connected to a battery of a vehicle and configured carry the current using the first magnetic tunnel junction device after modifying the output of the first digital to analog converter.

2. The method of claim 1, further comprising:
sequentially connecting a second fixed voltage and an output of a second digital to analog converter to an input of a second magnetic tunnel junction device, using a third single pole double throw analog switch;
sequentially connecting a V+ output and a V− output of the second magnetic tunnel junction device to an input of a second band pass filter using a fourth single pole double throw analog switch, wherein the third single pole double throw analog switch is configured such that the second fixed voltage is connected to the input of the second magnetic tunnel junction device when the V+ output is connected to the input of the second band pass filter, and the second digital to analog converter is connected to the input of the second magnetic tunnel junction device when the V− output is connected to the input of the second band pass filter; and
modifying the output of the second digital to analog converter such that an output of the second band pass filter produces an unsaturated sine wave wherein
measuring the current passing through the current carrying conductor comprises measuring the current passing through the current carrying conductor using the second magnetic tunnel junction device after modifying the output of the second digital to analog converter.

3. The method of claim 2, further comprising:
cancelling an external magnetic field interference using the first and second magnetic tunnel junction device.

4. The method of claim 1, wherein:
a processor is configured to modify the output of the first digital to analog converter such that the output of the first band pass filter produces the unsaturated sine wave; and
the first single pole double throw analog switch is configured to sequentially connect the first fixed voltage and the output of the first digital to analog converter to the input of the first magnetic tunnel junction device at a frequency lower than a frequency of an analog to digital converter of the processor.

5. The method of claim 1, further comprising:
transmitting data associated with the measured current, using a wireless transmitter unit, to a vehicle monitoring system.

6. The method of claim 1, wherein:
measuring the current passing through the current carrying conductor comprises measuring the current passing through the current carrying conductor using a second, third, and fourth magnetic tunnel junction device;
the first and the second magnetic tunnel junction device are mounted orthogonal to one another on a first side of the conductor; and
the third and the fourth magnetic tunnel junction device are mounted orthogonal to each other on a second side of the conductor opposite to the first side.

* * * * *